United States Patent [19]

Chapel, Jr. et al.

[11] Patent Number: 4,901,052
[45] Date of Patent: Feb. 13, 1990

[54] RESISTOR NETWORK HAVING BI-AXIAL SYMMETRY

[75] Inventors: Roy W. Chapel, Jr.; Robert W. Hammond, both of Edmonds, Wash.

[73] Assignee: John Fluke Mfg. Co., Inc., Everett, Wash.

[21] Appl. No.: 217,697

[22] Filed: Jul. 8, 1988

Related U.S. Application Data

[63] Continuation-in-part of Ser. No. 26,156, Mar. 16, 1987, Pat. No. 4,792,782, which is a continuation of Ser. No. 778,984, Sep. 23, 1985, abandoned.

[51] Int. Cl.⁴ .............................................. H01C 1/012
[52] U.S. Cl. ...................................... 338/308; 338/320
[58] Field of Search ............... 338/308, 309, 320, 295, 338/25, 22 R; 29/610.1, 612

[56] References Cited

FOREIGN PATENT DOCUMENTS 26007 7/1971 Japan .................................. 338/320

Primary Examiner—C. L. Albritton
Attorney, Agent, or Firm—Israel Gopstein; Mikio Ishimaru

[57] ABSTRACT

A resistive network formed on a substrate includes film resistors formed of resistive elements, each element having a plurality of portions symmetrically disposed relative to two axes of symmetry. The biaxially symmetric arrangement provides uniform resistance characteristics for the various film resistors, thus improving stability of resistance ratios among resistors of the network. TCR tracking for the film resistors, i.e., the TCR of a ratio of the resistors, is similarly improved. Where the elements of different resistors of the network are interleaved, the temperature of the different resistors is also made more uniform.

7 Claims, 4 Drawing Sheets

RESISTOR NETWORK HAVING BI-AXIAL SYMMETRY

CROSS REFERENCE TO RELATED APPLICATIONS

This application is a continuation-in-part of application Ser. No. 026,156, filed Mar. 16, 1987 by Robert W. Hammond now U.S. Pat. No. 4,792,782 for APPARATUS AND METHOD FOR PROVIDING IMPROVED RESISTIVE RATIO STABILITY OF A RESISTIVE DIVIDER NETWORK, which is a continuation of application Ser. No. 778,984, filed Sept. 23, 1985 by Robert W. Hammond for APPARATUS AND METHOD FOR PROVIDING IMPROVED RESISTIVE RATIO STABILITY OF A RESISTIVE DIVIDER NETWORK, abandoned.

FIELD OF THE INVENTION

This invention relates to improvement of stability of resistance characteristics of thin and thick film resistor networks, and more particularly to improvement of tracking of resistance characteristics among a plurality of resistors formed at different locations on a substrate.

BACKGROUND ART

Electronic test and measurement devices require high precision resistive divider networks, with a high stability of resistance ratios between and among resistors of the networks. To obtain the desired high precision of the resistance ratios, it has been the practice in the prior art to use wire-wound resistors in resistance divider networks because such resistors, although large and expensive to produce, exhibit the desired stability of resistance characteristics with respect to variations in temperature and operating voltage, for example.

However, modern measurement equipment typically utilizes much smaller and less expensive film resistors. Thus, it is desirable to obtain film resistors, whether thin or thick film, which exhibit similar stability in operating characteristics without incurring the additional expense typically associated with the wire-wound resistors or with special selection of film resistors.

A number of factors may influence and alter the ratio of two (or more) resistors formed on a film network. Such factors as:

spatial temperature variation,
temporal variation of film characteristics,
spatial variation of substrate surface condition, and
spatial variation of deposited film characteristics each affect the resistivities, hence resistances, resistance ratios, temperature of coefficient of resistance (TCR) and other characteristics of film resistors.

Because of the non-perfect substrates and non-perfect depositions thereon which form film resistor networks, both the film and the substrate on which it rests have characteristics which vary from area to area. Accordingly, resistors formed at different areas have different characteristics, as above noted. Moreover, however, such differences in characteristics lead to differences in response of the different resistors to external environmental impacts.

For example, when resistors at different locations of the substrate are formed of films with different characteristics, the films tend to oxidize at rates which may differ for the different locations, hence for the different resistors. Accordingly, the characteristics of the resistors will vary with time at different rates, thus providing a time variation in the ratio of the resistances in the network.

For example, it is known that the ratio of resistance between two resistors, $R_1/R_2$ for example, varies with time even when measured at a single temperature. Similarly, at any given time, the interface between the deposited film and the substrate will also affect the resistance ratio, as will the temperature distribution along the film network.

As another example, stress and strain applied to the network results in different effects on the different resistors, because of the different characteristics thereof. Thus, application of such external forces will result in undesirable variation in resistance ratio in a network.

Accordingly, it is desired to provide increased stability to such networks in spite of the presence of the above listed factors.

The prior art has attempted to provide a stabilized resistance ratio in a film resistance network by maintaining the mean temperature for two resistors at approximately the same value, thus attempting to provide the same resistivity for the two resistors. For example, it is known that the temperature of material forming a resistor varies with location along the resistor because of power dissipation in the resistor. Accordingly, one known prior art method attempts to provide a common temperature for two resistors by forming one resistor at a location in the proximity of a portion of a second resistor exhibiting an operating temperature corresponding to the mean temperature of the entire second resistor.

More particularly, a location is selected in a linear portion of one linearly distributed resistor, the location exhibiting a temperature which is reasonably expected to equal the mean (average) temperature of the entire resistor. Another resistor is formed at that location, with the first mentioned resistor being formed in two portions, on either side of the second resistor. Thus, the prior art attempts to minimize temperature differences between two resistors and to provide substantially a common temperature for the first and second resistors so that, as operating temperature changes, the actual temperatures of the two resistors will remain substantially equal to one another. Thus, the prior art looks at and attempts to correct an observed effect, the temperature dependent variation of resistance, by correcting a symptom (temperature differences) rather than by correcting an underlying cause of the symptom.

However, such an approach to stabilization of resistance ratios is difficult to carry out, since it is first necessary to determine a point in the first resistor which exhibits a mean temperature of the resistor. Further, the prior art approach is deficient in that it assumes that the TCR for the two resistors is the same and thus ignores variations in resistance caused by variation in TCR characteristics, which is caused by uneven distribution of resistor material. Additionally, the prior art approach is incapable of providing an arrangement of a plurality of resistors, and not just one, which may be used in one or more voltage divider networks with improved precision. Moreover, the above described prior art approach is needlessly complex, since it requires maintaining at the same values the actual temperatures of the two resistors, rather than the simpler task of maintaining a more nearly constant tracking of temperature coefficients of the resistors.

As disclosed in the parent application hereof, which application is hereby incorporated herein by reference, it is sufficient to provide a simple, novel and inexpensive arrangement, which arrangement is also used in the present invention, to obtain a significant improvement in tracking of resistance ratios. More particularly, it is improved tracking of temperature coefficients, rather than tracking the temperatures themselves, which is used in the parent application to obtain a significant improvement in precision and accuracy of film resistance divider networks and thus of measurement and test equipment using such networks.

The reduced complexity of the arrangement provided in the parent application for improving the precision of measuring equipment is due to the recognition of the fact that it is the inconsistency of temperature coefficients, rather than temperature values, which is an underlying cause of poor temperature tracking of resistance ratios. Accordingly, in the parent application it is recognized that improvement of consistency of the TCR is sufficient to achieve highly improved precision of the tracking of resistor ratios, irrespective of the actual operating temperature of the resistors. Indeed, as will be shown in the following description, the concept of the parent application hereof provides a minimum improvement of 885% over the prior art approach which attempts to equalize operating temperatures.

The added difficulty and expense of the prior art approach to obtaining precise matching of actual temperature values is thus unnecessary and fails to obtain the improved accuracy provided even in the parent application.

Unlike the prior art, the invention disclosed in the parent application hereof provides an arrangement of resistor components along the substrate of the network which eliminates differences in TCR between two resistors caused by variations in characteristics of the material forming the resistors as a function of location on the substrate, hereinafter referred to as geographic variations in these characteristics. In the copending parent application, it is recognized that ratio stability for a pair of resistors forming a voltage divider is dependent on three primary factors.

1. TCR tracking, defined as the difference in the temperature coefficient of resistance (TCR) of the resistors making up the divider;

2. VCR tracking, defined as the difference in the voltage coefficient of resistance (VCR) of the resistors; and 3. the difference in the temperatures of the resistors, which is addressed to some extent by the prior art.

In considering the effect of TCR tracking, TCR, which may be positive or negative, is defined as:

$$TCR = \frac{R_2 - R_1}{R_1(t_2 - t_1)}$$

where $R_2$ and $R_1$ are the resistance values of a single resistor at temperatures $t_2$ and $t_1$ respectively.

As noted in the parent application hereof, the TCR tracking factor, determined by the differences in the TCR's of the resistors comprising the network, has a most significant effect on ratio stability. In a two resistor network, if the TCRs of the two resistors comprising the network are identical, the ratio of the two resistors will remain constant as the ambient temperature changes. When the TCRs of the resistors are not the same, the resistance ratio includes a component which varies due to TCR effects. This component of the ratio will change as the ambient temperature changes. The greater the difference in the TCR's of the two resistors, the greater will be the change in the ratio and the poorer will be the ratio stability. By reducing or eliminating such differences, the ratio stability is significantly improved.

In considering the effect of VCR tracking, VCR is defined as:

$$VCR = \frac{R_2 - R_1}{R_1(E_2 - E_1)}$$

where $R_2$ and $R_1$ are the resistance values of a single resistor at applied voltages $E_2$ and $E_1$ respectively.

The VCR of deposited film resistors is always negative, and for well designed, properly manufactured, thin film resistors, the VCR is generally quite low. For example, thin film resistors made from 100 to 200 ohms per square material typically have VCR's in the range of 0.001 to 0.01 ppm/volt. Hence, a 10 megohm resistor will decrease in ohmic value by 1 to 10 ppm (10 to 100 ohms) when the voltage applied thereto is increased by 1,000 VDC (e.g. from 100V to 1100V).

The effect of the VCR on the absolute value of a film resistor is essentially instantaneous while the effect of the TCR on the absolute value of a film resistor depends on the thermal time constant of the resistor. Typically 90% of the temperature rise is complete in less that one minute. The combined effect of VCR and TCR on the resistor value is called the power coefficient of resistance or PCR, and is the algebraic sum of the change in resistance of a resistive element due to an increase in applied voltage as determined by the VCR thereof (always negative) and the change in resistance of the same resistive element due to the self heating caused by the same increase in applied voltage, as determined by the TCR thereof (which may be either positive or negative). The combined effect (PCR) can cause the resistor value either to increase or decrease, or in rare cases, even to remain constant.

In considering the effect of temperature differences between the resistors, the relative temperature of the two resistors depends upon three parameters:

1. the power dissipated per unit area by each resistor;
2. the distance between the two resistors; and
3. the thermal conductivity of the substrate.

As described above, tee prior art does not address these parameters, recognizing only that power dissipation causes an uneven temperature distribution in a resistor and concluding that at some point in a resistor there will be found a location possessing a temperature equal to the mean temperature of the resistor However, such an approach assumes that temperature characteristic of the resistor is uniform along its length. That is, the prior art considers power dissipation, and hence temperature distribution, to be substantially uniform along the resistor, leading to a conclusion that the maximum temperature of a resistor will always be at the center point thereof, i.e., at the point furthest removed from the two end portions of the resistor, which are further assumed always to be at the minimum temperature of the resistor. Thus, it is concluded by the prior art that the average temperature of a resistor will be observed at a point approximately half way between the center point and an end point thereof, i.e., at a point ¼ the distance between one end portion and the other end portion of a linear resistor.

No consideration is given in the prior art to the fact that materials forming the resistor are inevitably deposited at nonuniform thickness along the substrate, and that for this and other reasons a resistor will thus exhibit one temperature characteristic on one portion of the substrate and another characteristic on another portion. Thus, the attempted approach of the prior art, which fails to correct for or even consider such geographic variations in TCR and which presumes a predetermined point of the resistor to exhibit average temperature for a resistor, is of necessity in error.

However, as noted in the copending parent application, the geographic variation of characteristics of the resistive material is of significance in determining the relative temperatures of two resistors. For example, regardless of the method used to deposit the resistive material on the substrate, there is always some random variation in the metallurgy of the film. Thus, from one edge of the substrate to the opposite edge the TCR of the resulting metal film tends to vary smoothly, although not necessarily linearly, with distance from the reference edge. Hence, it is virtually impossible to have resistors with identical TCR's so that even if the temperatures of two resistors track, the resistances thereof will not because of nonuniformity of TCR.

There has been a long-felt need for a film resistor divider network where the TCR difference of the individual resistors approaches zero over the operational temperature range and the temperature difference of the individual resistors approaches zero over the operational voltage range. As above noted, in the parent application hereof it is recognized that TCR varies from one edge of the substrate to the opposite edge thereof and thus that for different resistors, although precisely formed to have identical dimensions, the TCRs will be different. By providing an arrangement wherein each resistor may be formed as a plurality of resistor portions, and wherein the portions are interleaved in a regular manner, the parent application hereof provides an approach to overcoming the above noted difficulties of the prior art.

However, the approach of the parent application provides more than mere temperature stability. As hereinabove noted, geographic variation occurs in any of the characteristics of the resistance, and not only in the TCR thereof. Accordingly, the resistance ratios of film resistor networks formed on a substrate tend to vary with time and with external environmental factors, such as torque, stress and strain, thermal shock and temperature changes applied to the unit. By providing a layout in which two resistors, for example, undergo the same characteristic variations, in the arrangement disclosed in the parent application the various effects of environmental factors such as externally applied thermal shock, passage of time, and the like, are seen substantially equally by the two resistors. Thus, although the resistances of the two resistors continue to be affected by such factors, the resistance ratio between the two resistors becomes more highly stabilized.

Further, the approach of the parent application sharply reduces the settling time when switching different voltage levels across the netword, such as when switching 100 volts to 1100 volts, for example. There are several reasons for this. First, each of the five high value subelements in a 9 element 2 resistor network dissipate only 1/5 as much as a single high value element in a 2 resistor side-by-side network, hence the temperature rise of each is greatly reduced. Second, being smaller, the subelements reach their maximum temperatures sooner. Third, because of the interleaing, the centers of temperature differentials are greatly reduced. All three factors combine to sharply reduce settling time—a most important consideration in systems applications.

The ultimate reduction in settling time and improvement in TC tracking and ratio stability results when each leg of the serpentine pattern of one resistor is interleaved with each leg of the serpentine pattern of the other resistor. The 9 section arrangement discussed above represents a practical compromise with this ideal.

However, the approach of the parent application overcomes the effects on resistance ratio of variation in TCR and other characteristics only in one direction along a substrate. Although the resultant TCR tracking ratio, for example, is shown in the parent application to improve significantly over the prior art, there remains a need for still further improvement in consistency of resistance ratios and for enhancing tracking of resistance ratios still further for film resistors formed on a substrate, thus to improve ratio stability of voltage divider networks still more significantly than had been previously possible.

SUMMARY OF THE INVENTION

It is accordingly an object of the present invention to provide a layout for film resistors which maintains a stable resistance ratio between resistors, with reduced time dependent and environmentally dependent variation.

It is another object of the invention to provide a resistive divider network wherein the TCR differences among a plurality of individual film resistors approach zero over the operational temperature range.

It is a more specific object of the invention to provide a resistive divider network wherein a plurality of film resistors are arrayed on a substrate in a bilaterally symmetric arrangement in order to stabilize resistance ratios therebetween and to withstand time passage as well as environmental factors such as thermal shock, stress, strain and temperature with improved stability.

Still a more specific object of the invention is to provide a resistive divider network wherein a plurality of film resistors are arrayed on a substrate in a bilaterally symmetric arrangement in order to reduce TCR differences among the film resistors and thus to improve the temperature stability of a resistance ratio of the resistors.

Another object of the invention is to provide an arrangement of a plurality of resistors along a substrate wherein both TCR variations between various resistors and temperature differences therebetween approach zero over the operational voltage range.

In accordance with the present invention, each of the elements of a resistive divider is formed as a plurality of subelements uniformly spaced according to two axes of symmetry defined for the substrate and interconnected to form discrete resistor elements. Preferably, provision is made for resistive trimming of each subelement in order to obtain desired absolute resistance values and ratios.

The present invention thus advantageously improves spatial stability of resistance ratios of resistors formed on a film network by letting one resistor see as much variation in geometry and location as seen by another resistor and thus experience as much variation in resistance characteristics as the other. Temporal variation is thus also reduced, since the resistance of the one resistor will drift with time at the same rate as the other. Both spatial and time stability of the resistive network are thus improved.

Although power coefficient matching is related to TCR, the present invention provides more than mere matching of TCR. Even after such matching, differences in resistance characteristics remain. Where such differences are caused by inconsistencies in the substrate surface as well as in the deposited film characteristics, the effects of the inconsistencies are uniformly distributed by the present invention, thus to provide for each of the resistors a distribution of portions having various values of the characteristics and a more uniform total resistive characteristic.

Other objects, features an advantages of the present invention will become readily apparent to those skilled in the art from the following description wherein there is shown and described a preferred embodiment of the invention, simply by way of illustration and not of limitation of the best mode (and alternative embodiments) for carrying out the invention. The invention itself is set forth in the claims appended hereto. As will be realized upon examination of the specification with due reference to the drawings, the present invention is capable of still other, different, embodiments and its several details are capable of modifications in various obvious aspects, all without departing from the invention which is recited in the claims. Accordingly, the drawings and the descriptions provided herein are to be regarded as illustrative in nature and not as restrictive of the invention.

BRIEF DESCRIPTION OF THE DRAWINGS

The accompanying drawings, incorporated into and forming a part of the specification, illustrate several aspects of the present invention and, together with the description, serve to explain the principles of the invention. In the drawings.

DESCRIPTION OF THE PREFERRED EMBODIMENT

Figure 1:
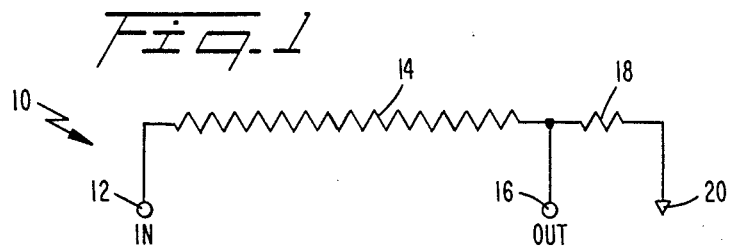
FIG. 1 is an electrical circuit schematic representing a typical two resistor divider network.

Referring now to FIG. 1, therein is shown a schematic representation of a resistor divider network 10. The network 10 has an input terminal 12 connectible to a first resistive element 14. The first resistive element 14 is connectible to an output terminal 16 and to a second resistive element 18 which is connectible in turn to a ground terminal 20.

As would be evident to those skilled in the art, the terminals are referred to for clarity only since divider networks may be integral with other circuit components and thus may not have terminals. Similarly, the input, output, and ground terminology is utilized for clarity only since multiple resistor networks could have multiple inputs, outputs, and grounds. Further, the elements are considered "connectible" because in fact the resistors may not be connected to each other or to a terminal when manufactured as a complete network. Indeed, it is possible that all connections may be made apart from the network itself.

Figure 2:
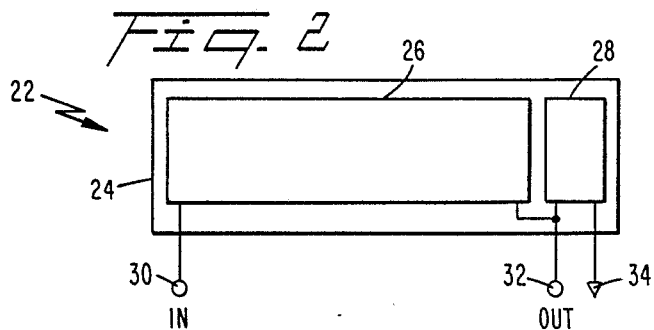
FIG. 2 is a plan view of a prior art resistor divider network.

Referring now to FIG. 2, therein is shown a prior art film resistive divider network 22 which has resistance ratio stability adequate for some, but not all, applications formerly requiring wirewound resistors.

The film resistor network 22 includes a substrate 24. The substrate 24 could be glass or other material but is by preference alumina ($Al_2O_3$) with a thermal conductivity about 5% that of copper. Typically, the substrate is ¾" long by ¼" wide and 0.025" thick.

Deposited on the substrate 24 by sputtering, vacuum deposition or other means is a resistive material which in subsequent manufacturing operations is coated with a photoresistive material, photo masked, exposed to ultra violet light, then chemically etched to remove the unwanted material leaving the desired resistive elements 26 and 28 in a serpentine pattern which may be so fine as to be generally considered rectangular. As is well known to those skilled in the art, the serpentine pattern conventionally also includes shunts which are vaporized away by a laser during a "laser trimming" operation to establish the exact resistance and ratio values.

The resistive material almost universally used is Nichrome (a registered trademark of Driver Harris Company) alloy, which contains 60% nickel, 24% iron, 16% chromium, and 0.1% carbon. Due to variations in metallurgy of the film deposited onto the substrate, various characteristics, such as the TCR of the resulting metal film, vary from one edge of the substrate to the opposite edge. The TCR tends to vary smoothly, although not necessarily linearly, with distance across the substrate. The first resistive element 26 is the higher power dissipating element of the two.

The first resistive element 26 is connectible to an input terminal 30 and to an output terminal 32 which is also connectible to the second resistive element 28. The second resistive element 28 is further connectible to a ground terminal 34.

While the efficiency of heat transfer between the two resistive elements 26 and 28 increases as the size of the elements decrease and the space between them decreases, there is a limit on size imposed by a number of factors.

Figure 3:
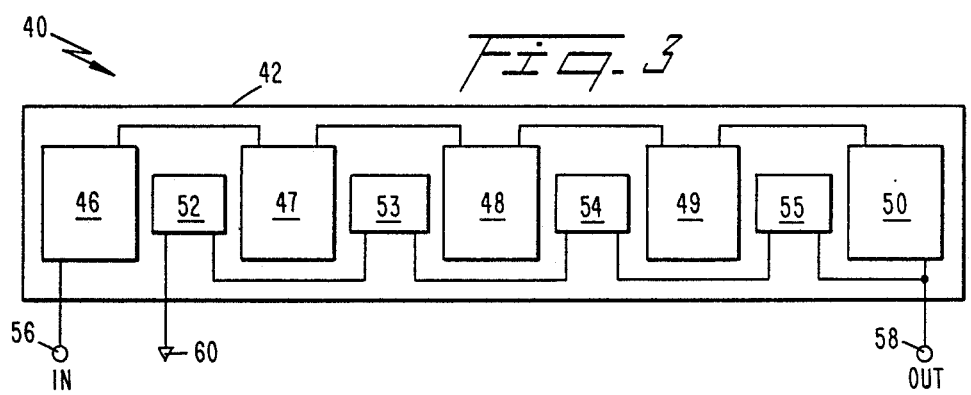
FIG. 3 is a plan view of a resistor divider network provided in accordance with a concept of the parent application hereof.

Referring now to FIG. 3, therein is shown an improved resistor divider network 40 according to the parent application hereof. The network 40 is disposed on a substrate 42. The substrate 42 is somewhat larger than a conventional similar resistor divider network, being 1 ½" long by ⅜" wide and 0.025" thick. Deposited on the substrate 42 is a resistive material which is divided up into a number of portions. One portion defines a first resistive element which is made up of first resistive subelements 46 through 50. Interleaved between the first resistive subelements 46 through 50 is a second resistive element which is made up of second resistive subelements 52 through 55.

The first resistive subelements 46 through 50 are interconnected in series to form the equivalent of the first resistive element 26 of FIG. 2 and, similarly, the second resistive subelements 52 through 55 are interconnected in series to form the equivalent of the second resistive element 28 of FIG. 2.

Although a series connection is shown, it should be recognized that the inventive concepts of the parent application and of the present application may also be applied to a parallel interconnection of resistors. Moreover, the same concepts may be applied to hybrid series-parallel interconnections of resistors.

The first subelement 46 of the first resistive element, at one edge of the substrate, is connectible to an input terminal 56 and the last subelement 50 of the first resistive element at the opposite edge of the substrate is connectible to an output terminal 58. The first subelement 52 of the second resistive element is connectible to a ground terminal 60 while the last subelement 55 of the second resistive element is connectible to the output terminal 58.

By comparing the resistor divider networks of FIG. 2 and FIG. 3, it is seen that substantial improvement in resistive ratio stability can be achieved just in the TCR tracking.

As described in the parent application hereof, in an illustrative example the TCR of the resistive material may vary from 10.00 ppm/°C. at the left edge of the substrate to 6.00 ppm/°C. at the right edge of the substrate for the structures of both FIGS. 2 and 3.

For such an arrangement, the approximate TCR of the right hand edge of element 26 of network 22 will be 6.50 ppm/°C. The average TCR for the resistive element 26 is thus (10.00+6.50)/2 or 8.25 ppm/°C. With the left side of the second resistive element 28 being approximately 6.40 ppm/°C. the average TCR of the second resistive element 28 is (6.40+6.00)/2 or 6.20 ppm/°C. Accordingly, for the prior art arrangement shown in FIG. 2 the difference between the TCR's, or TCR tracking, is (8.25−6.20) or 2.05 ppm/°C.

For the network 40, improved in accordance with the parent application hereof, it is shown in the disclosure of the parent application that, even for a worst case situation wherein the TCR decreases non-linearly across the substrate, a dramatic improvement is still achieved. As illustrated therein, TCRs for the 9 subelements of FIG. 3 may be assumed to vary from left to right non-linearly, as follows:

Subelement No:
| 46 | 52 | 47 | 52 | 48 | 54 | 49 | 55 | 50; |
|---|---|---|---|---|---|---|---|---|
| 10.0 | 9.25 | 8.5 | 8.25 | 8.0 | 7.5 | 7.0 | 6.6 | 6.2 |

(TCR in ppm/°C.);

the TCR of subelements 46 through 50 thus:

10.0+8.5+8.0+7.0+6.2=7.94;

and the TCR subelements of 52 through 55 is:

9.25+8.25+7.5+6.6=7.90.

Accordingly, in the arrangement of FIG. 3, the TCR tracking is 7.94−7.90=0.04 ppm/° C. This is an improvement over the 2.05 ppm/° C. tracking (of the simple side-by-side arrangement shown in FIG. 2) of 2.05/0.04∼51 to 1.

Thus, in a non-linearly varying TCR the improvement attained by use of the concept of the parent application would exceed 5,100%. It was also noted in the parent application that as the number of subelements increases, the TCR of the resistance ratio for the network improves, approaching 0.

It is further noted in the parent application that if the variation in TCR is linear from one side of the substrate to the other, the TC tracking of a two resistor divider would always be perfect (zero), regardless of the number of subelements used, providing that the total number is always an odd number.

To illustrate this suggestion, it is noted that for a linearly varying TCR, the TCR for subelements 46 through 50 may be 9.4, 8.6, 7.8, 7.0, and 6.2 ppm/°C. For subelements 52 through 55, uniformly spaced between consecutive ones of the subelements 46-50, the TCR would thus be 9.0, 8.2, 7.4, and 6.6 ppm/°C. The average TCR for the first resistive element would thus be (9.4+8.6+7.8+7.0+6.2)/5=39/5=7.80 ppm/°C. For the second resistive element, the average TCR would then be (9.0+8.2+7.4+6.6)/4=31.2/4=7.80 ppm/°C. Since the average TCR's for the two resistors are the same, the TCR difference, or tracking, is thus confirmed to be zero for a linear variation of TCR along a substrate.

Figure 4:
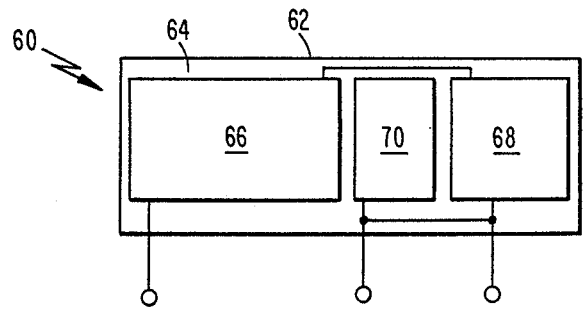
FIG. 4 is a plan view of a prior art resistor divider network utilizing a prior art approach to equalization of temperature for different resistive elements.

Referring now to FIG. 4, there is illustrated a prior art attempt to equalize the temperatures of two resistors by placing one resistor at a location between two components of another resistor, the location selected to have a temperature which is the mean temperature for the other resistor. More particularly, a resistor network 60 is provided on a substrate 62, wherein a first resistor 64 is formed of two serially connected components 66 and 68 and wherein a second resistor 70 is shown as being located between the two components 66 and 68. As hereinabove described, this prior art approach attempts to provide equal mean temperatures for the two resistors 64 and 70 by selecting the location for second resistor 70 as the location having a temperature which is the mean temperature for resistor 64.

As particularly described in the prior art, such a location is found between the middle and an end of the resistor. As specifically illustrated in the prior art, resistor component 66 is approximately 10 units long, component 68 is 4 units long, and resistor 70 is 3 units long. Accordingly, for the illustration used in connection with FIGS. 2 and 3, let it be assumed that TCR varies from 10 ppm/°C. at the left edge of the resistive material to 6 ppm/°C. at the right edge of the material shown in FIG. 4.

Even for a best case situation, wherein the network 60 exhibits linear variation of TCR, the average TCR of components 66 and 68 would be approximately 8.824 ppm/°C. and 6.471 ppm/°C., respectively, while the average TCR of the second resistor 70 would be 7.294 ppm/°C. The average TCR of the first resistor 64, however, would be (10*8.824+4*6.471)/14=8.152 ppm/°C.

By providing an equalization of temperature for the two resistors, the prior art arrangement thus provides a TCR tracking of 8.152−7.294=0.858 ppm/°C. Upon comparison to the tracking (0.04 ppm/°C.) provided even by applicants' non-linear arrangement of FIG. 3, it is seen that the structure disclosed in the parent application provides an improvement of 0.858 ppm/°C./0.04 ppm/°C.=21.45, or 2145%. Clearly, if a linear variation of TCR were assumed for applicants' arrangement of FIG. 3 to correspond to the linear variation assumed for FIG. 4, a much higher improvement over the prior art would be computed, approaching infinite improvement for zero tracking as computed above for FIG. 3 under the assumption of linearity. Stated differently, for a more realistic assumption of a non-linear TCR variation of the arrangement of FIG. 4 to correspond to the nonlinear variation presumed in calculating the 0.04 ppm/°C. tracking for FIG. 3, the tracking of the prior art would be even worse than above calculated, exceeding 0.858 ppm/°C. and resulting in an even greater difference with respect to the arrangement of FIG. 3.

Figure 5A:
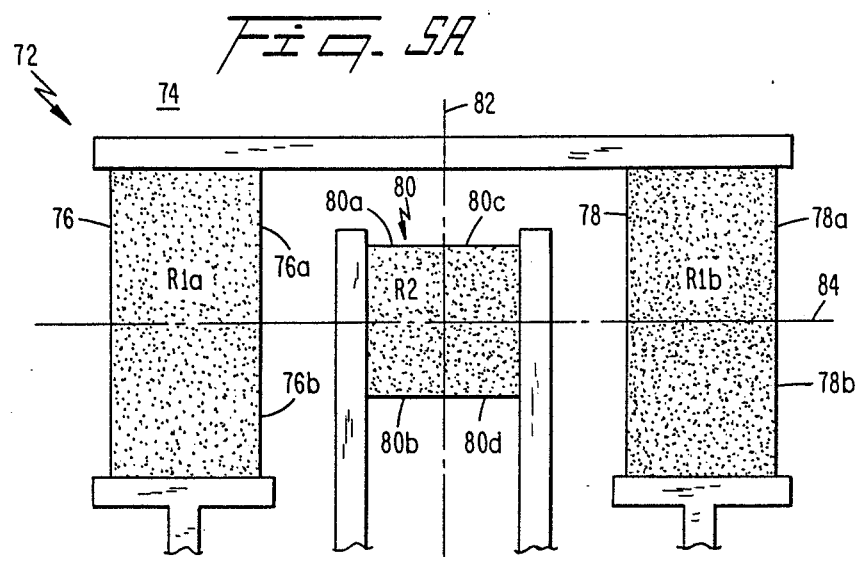
FIGS. 5A and 5B show a plan view of a two-resistor network layout in accordance with the present invention and an illustrative example of an advantage provided by the invention.
Figure 5B:
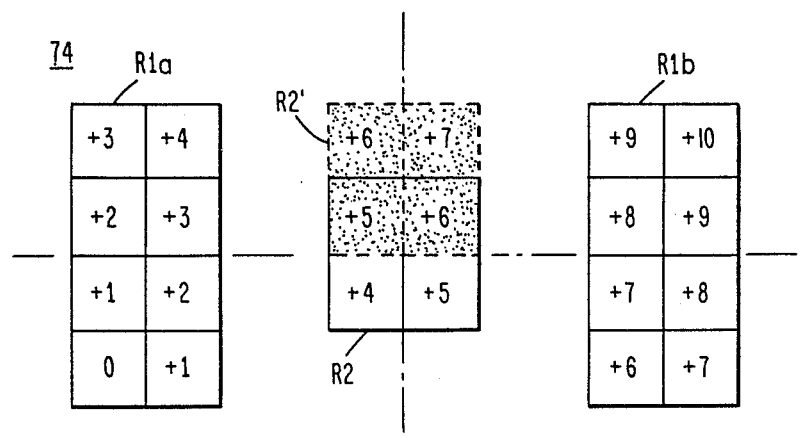

Referring now to FIGS. 5A and 5B, there is illustrated a biaxially symmetric arrangement of two resistors in accordance with the present invention to provide still greater improvement in TCR tracking than provided in FIG. 3. More particularly, the structure of FIG. 3 may be considered to provide a resistive layout which is symmetric about a vertical axis.

Thus, the arrangement of FIG. 3 overcomes geographic variations in the characteristics of the resistive material from left to right by providing a balanced set of subelements wherein:

a first subelement (e.g., 46) of a resistor having a high TCR is balanced by a second subelement (e.g., 50), located symmetrically thereto, having a low TCR, a third subelement (e.g., 47) with a lower TCR than the first subelement 46 is balanced by a fourth subelement (e.g., 49), located symmetrically thereto, with a low TCR, but having a higher TCR than second subelement 50, and wherein subelement 48 is provided with approximately an average TCR for the network.

Similarly, for the second resistive component formed of subelements 52-55, a balanced arrangement is provided wherein:

a first subelement (e.g., 52) having a high TCR is balanced by a second subelement (e.g., 55), located symmetrically thereto, having a low TCR, and a third subelement (e.g., 53) having a lower TCR than the first subelement is balanced by a fourth subelement (e.g., 54), located symmetrically thereto, having a low TCR which is higher than the TCR of the second subelement.

It should be recognized that although the foregoing (as well as subsequent) examples of the improvement provided by the invention relate to TCR, similar improvements result in resistance ratio stabilization with respect to any of the geographically varying characteristics of the film resistors formed on the substrate.

FIG. 5A shows a portion of a resistor layout, excluding various components and terminals which are unnecessary to understand the invention. Therein is provided a resistive network 72, disposed on a substrate 74, and including two resistor elements. The first resistor element includes first subelement 76 and second subelement 78, while the second resistor element includes a single illustrated subelement 80. In the figure, there are shown a vertical center line 82 and a horizontal center line 84 for the substrate.

In accordance with the present invention, each of the resistor elements is comprised of a balanced set of subelements which are symmetrically arranged with respect to both the vertical and horizontal center lines of the substrate. Accordingly, in the embodiment of FIG. 5A, subelement 76 includes first and second portions, 76a and 76b, arranged on opposite sides of horizontal center line 84. Similarly, subelement 78 includes first and second portions 78a and 78b arranged on opposite sides of horizontal center line 84. Subelement 80, located at the intersection of the two centerlines, is comprised of four portions 80a, 80b, 80c and 80d.

Similarly to the arrangement of FIG. 3, subelement 76 is balanced by subelement 78. However, two axes of symmetry are used to provide even greater accuracy in balancing. Thus, portion 76a of subelement 76 is balanced by portion 78a of subelement 78, the two portions being located symmetrically with respect to each other relative to axis of symmetry 82. Similarly, portion 76a of subelement 76 is balanced by portion 76b of subelement 76, the two portions being located symmetrically with respect to each other relative to the axis of symmetry 84. It will be appreciated that this arrangement means that portions 76a, 76b, 78a, and 78b are located symmetrically with respect to both axis of symmetry 82 and 94. FIG. 5B shows an arrangement of resistors R1a, R1b and R2 corresponding to the structure of FIG. 5A, with numerical values of TCR included. Therein, it is assumed that TCR varies linearly, increasing by 1 unit from the lower left-most portion of R1a both vertically and horizontally. The average TCR is computed below for R1, which comprises R1a and R1b, as well as for R2. In the illustrated arrangement, resistors R1 and R2 both conform to the biaxially symmetric structure of the invention. It is thus shown that for both resistors the average TCR is identical.

However, it is also shown that if resistor R2 is somewhat displaced, so as to violate the biaxial symmetry requirement of the invention (although symmetrically arranged about one of the axes), the average TCR's for R1 and R2 differ.

It is particularly noted that for R1a the average TCR is $(0+1+1+2+2+3+3+4)/8=16/8=2$ ppm/°C. Similarly, for R1b the average TCR is $(6+7+7+8+8+9+9+10)/8=64/8=8$ ppm/°C. The average TCR for $R1=R1a+R1b$ is thus $(16+64)/16=80/16=5$ ppm/°C.

For the resistor R2 the average TCR is $(4+5+5+6)/4=20/4=5$ ppm/°C., which is an exact match for the average TCR of resistor R1. Thus, the arrangement of FIG. 5b, conforming to the inventive concept, provides an exact match for average TCR's of the two biaxially symmetric resistors.

However, if resistor R2 were moved upwardly by one unit, to the position enclosed by the dashed line and identified as R2, in the Figure, the resulting average TCR would be changed. More particularly, the changed value would be $(5+6+6+7) 4=24/4=6$ ppm/°C. Thus, for a structure in which the resistors are not biaxially symmetric, even though symmetric with respect to one axis of symmetry, the average TCR's of the resistors are not as closely matched.

Referring again to the structural arrangement of FIG. 5A, although portions 76a and 76b of FIG. 5A are shown as forming a single, continuous, subelement, it should be recognized that the two portions may themselves each be a complete subelement. That is, it is not necessary that portions 76a and 76b be formed as a single, continuous resistive element straddling the vertical centerline 82 on the substrate. Instead, the two portions may be separately formed and connected by a connecting metallizing pattern. Nor is it necessary that the two portions 78a and 78b be formed as a single, continuous resistive element straddling the vertical centerline. These two portions may also be separately formed and connected by a connecting metallizing pattern.

The only requirement is that portion 76b be balanced by portion 78a, and that portion 76a be balanced by portion 78b, wherein balancing of two portions is achieved by symmetrical placement with respect to one another relative to the two axes of symmetry 82 and 84. Similarly, portions 80a, 80b, 80c and 80d need not be formed as a single subelement but may be separated and formed as two or four subelements, provided that portions 80a and 80d are symmetrically located with respect to each other relatively to both the vertical and horizontal centerlines 82 and 84 and that portions 80b and 80c are symmetrically located with respect to each other relative to both centerlines 82 and 84.

Figure 6:
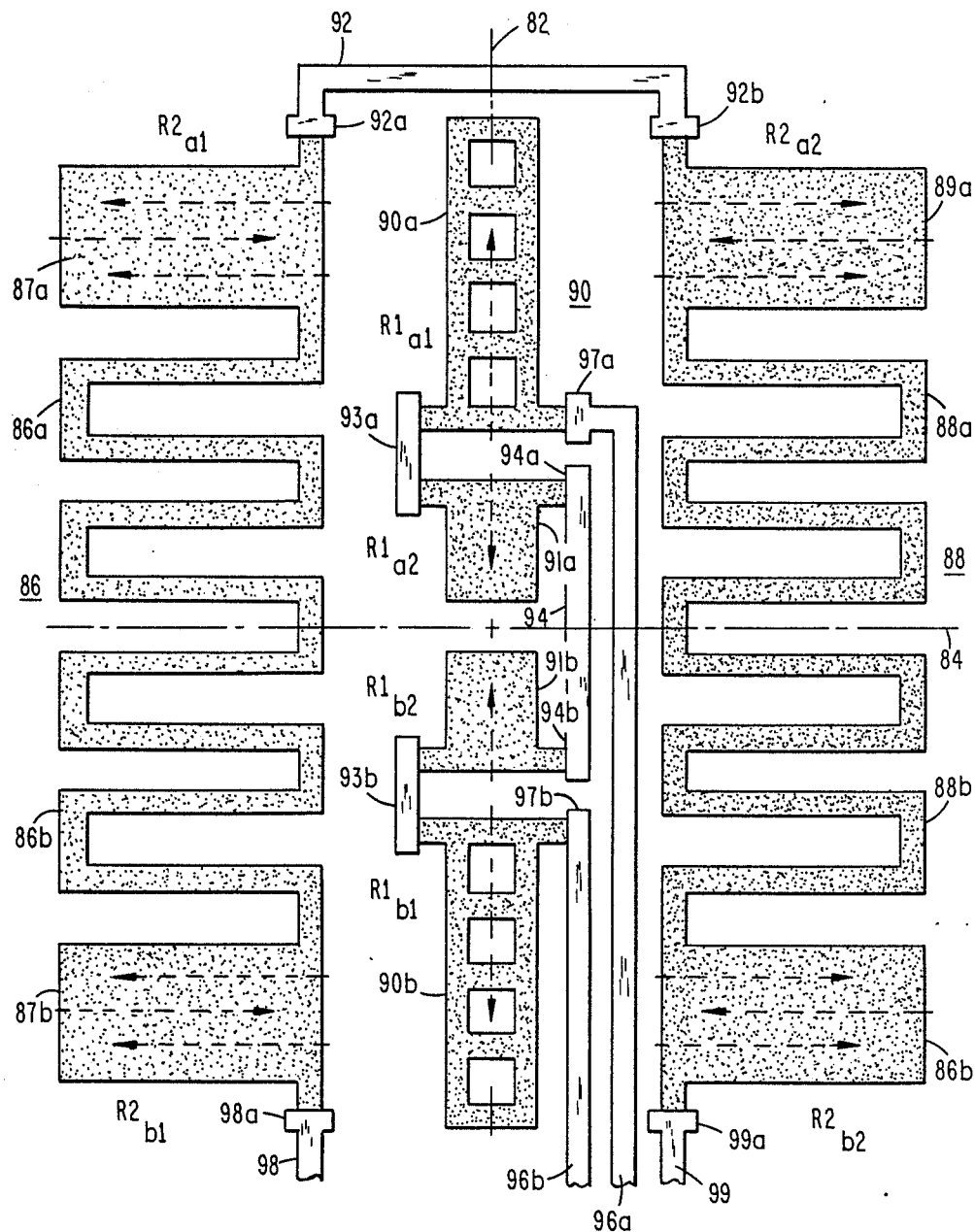
FIG. 6 illustrates an alternate embodiment of a two-resistor network layout according to the invention.

Such an arrangement is illustrated in the embodiment shown in FIG. 6. As shown therein, the first resistor of a resistive network 85 is comprised of a first subelement 86, formed of first and second portions 86a and 86b, respectively. A second subelement 88 is formed of first and second portions 88a and 88b. The second resistor of the network is illustrated as being formed of a pair of disconnected laser trimmable portions 91a and 91b.

Each of the portions shown in FIG. 6 includes at least one trimming section, indicated by dashed arrows, to permit laser trimming or similar processes to adjust the resistance to within predetermined limits of the nominal values thereof. It should be recognized, however, that such trimming sections are not a necessary aspect of the present invention. Thus, sections 87a and 87b which are parts of subelement 86 are provided for trimming portions 86a and 86b while sections 89a and 89b which are parts of subelement 88 are provided for trimming portions 88a and 88b, respectively. Further, sections 90a and 90b are provided for incremental trimming the portions of resistive component 90. Sections 90a and 90b provide for discrete incrementation of the resistive values by severance of any of a plurality of interconnecting links provided therein, while sections 87a, 87b, 89a, 89b, 91a and 91b provide a substantially continuous adjustment for the resistances of subelements 86 and 88, as well as component 90. Preferably, the trimming sections, similarly to the portions trimmed thereby, are also placed symmetrically relatively to the two axes of symmetry 82 and 84.

It should be appreciated that when the trimming sections are provided, in accordance with the invention, the trimming operation should be geometrically identical for the symmetric sections. That is, to obtain the advantages of the invention, each of the trim sections 87a, 87b, 89a and 89b, for example, should be trimmed an identical amount. However, the amounts trimmed are to be geometrically, rather than ohmically, identical. In other words, if a two-micron square is trimmed from the upper left portion of section 87a, a similar square is to be trimmed from the upper right portion of 89a, from the bottom right portion of 89b, and from the bottom left portion of 87b. In view of the different resistivity of the material being trimmed at the four different locations, a different ohmic trim is performed for each location. Such a trimming process, once appreciated from the foregoing description, may be easily implemented using standard computer controlled laser (or other) trimming devices.

In the embodiment of FIG. 6, the various portions and components are interconnected as follows. A horizontal metal connector 92 connects subelement 86 to subelement 88, via connections 92a and 92b, respectively. However, a metal connector is not necessary. Thus, the resistances may be connected by resistive material, including the Nichrome forming the resistor portions. Accordingly, portions 86a and 86b are directly connected to one another, as are the portions 88a and 88b. However, a vertical metal connector 94 is used to connect portions 91a and 91b via connections at 94a and 94b, respectively. Moreover, a vertical metal connector 93a is also used to connect the trimming section 90a and the resistive portion 91a, while a vertical metal connector 93b is also used to connect the trimming section 90b and the resistive portion 91b.

Connectors are also provided to permit external connection to the various resistors of the network. Thus, a connector 96a may provide a connection to the trimming section 90a via a connection 97a and a connector 96b may provide a connection to the trimming section 90b via a connection 97b. A connector 98 includes a connection 98a to portion 86b of subelement 86, and provides a connection for contacting portion 86b of the resistive network via trim section 87b, while a connector 99 includes a connection 99a to trim section 89b of portion 88b of subelement 86.

Figure 7:
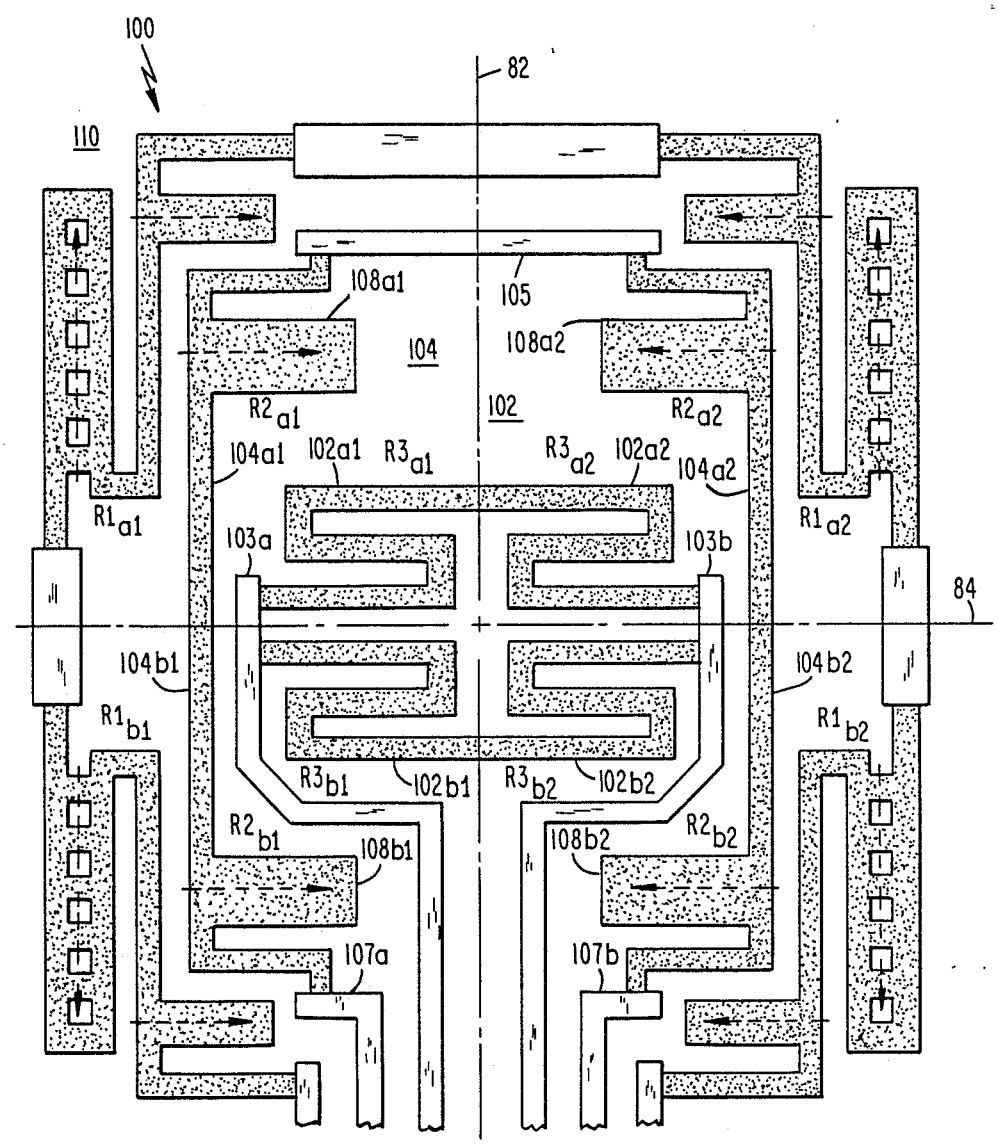
FIG. 7 is a plan view of a three-resistor network layout in accordance with the invention.

Referring now to the embodiment of the invention illustrated at FIG. 7, there is shown a biaxially symmetric arrangement of three resistors in a resistive network. As provided therein, a network 100 includes a first subelement 102, disposed at the intersection of the axes of symmetry 82 and 84. The resistor 102 is formed as two subelements, above and below the horizontal centerline 84, each having two portions, on either side of vertical centerline 82. Thus, there are provided four portions, 102a1, 102a2, 102b1 and 102b2 to form resistor 102.

As will be appreciated form the drawing figure, in the present instance the horizontal connection between subelements 102a1 and 102a2 is provided by the resistive material forming the resistor, while the vertical connection the subelements is provided by metal interconnections 103a and 103b. Moreover, no trimming sections are provided for the resistor 102.

A second resistor 104 is also formed as two subelements, above and below the horizontal centerline 84, each having two portions, on either side of vertical centerline 82. Thus, there are provided four portions, 104a1, 104a2, 104b1 and 104b2 to form resistor 104. However, in construction resistor 104, portions 104a1 and 104a2 are connected by a metal connector 105 while portions 104a1 and 104a2 are directly connected (by resistive material) to portions 104b1 and 104b2, respectively. Portions 104b1 and 104b2 are connected by an interconnection network, not shown at contact points 107a and 107b.

As is also clear from the arrangement of FIG. 7, continuous trimming sections of resistor 104 designated as 108a1, 108a2, 108b1 and 108b2 are symmetrically provided for each of the portions 104a1, 104a2, 104b1 and 104b2, respectively.

A third resistor 110 is similarly included, having four portions each including both a continuous and a discrete trimming section. The portions are each connected to the other portions of resistor 110 by a metallic conductor.

Although the various portions of resistor 110 are not explicitly labelled, each of the subelements and portions of resistors 102, 104 and 110 in FIG. 7 is paired with a corresponding, symmetrically located, matching subelement. It should be noted that various portions of the three resistors 102, 104 and 110 may be considered as parts of the same or different resistors of the network 100. That is, resistors 102 and 104 may be interconnected to form a single symmetric resistor. Thus, the resistive network of FIG. 1 may represent a network of one, two or three resistive elements.

Moreover, it is clear that although the various resistive portions may be connected on the printed circuit, as shown for portions 102a1-102a2, or 108a1-108a2, the portions may be connected elsewhere, as indicated by contacts 107a and 107b for portions 108b1 and 108b2. Accordingly, a resistor may be considered to include a parallel connection of a pair of series combinations (e.g., 102a1-102a2 in parallel with 102b1-102b2). Alternatively, another interconnection may be contemplated, as indicated by metal conductors connected to various ones of the other resistive portions shown in FIG. 7.

For reasons hereinabove elaborated with respect to the symmetrical arrangement of FIG. 3 relative to a single axis of symmetry, balancing of portions of subelements relative to two axes of symmetry results in reduction or elimination of the effects of geographical variations of TCR and other characteristics on resistance ratios of elements in a network. For example, the thickness of the resistive Nichrome material deposited on the substrate may vary with position, from a very thin layer at the lower left hand corner of the substrate to a very thick layer at the upper right hand corner of the substrate. Thus, the thickness and the TCR and other characteristics of the resistive elements vary from top to bottom as well as from left to right.

By providing point symmetry, or biaxial symmetry as hereinabove described, each resistor will have portions which are thick and portions which are thin, symmetrically distributed about a point of substantially average thickness or average characteristics. Thus, arrangement of the four portions 76a, 76b, 78a and 78b according to FIG. 5, and portions 102, 104, 104,, 106 and 106' according to FIG. 7, results in more nearly uniform characteristics for each of the resistive subelements and portions. For example, the first resistive element of FIG. 5A, formed of subelements 76 and 78, includes portions above and below the horizontal center line as well as to the right and left of the vertical center line. Similarly, the arrangement of subelement 80 symmetrically relatively to the two axes of symmetry results in a more nearly uniform TCR for that resistive element as well.

Moreover, inasmuch as the same axes of symmetry are used for each of the resistances, the TCRs for each of the resistors are substantially equal to one another. By using the center lines of the substrate as the axes of symmetry, the TCR of each of the resistive elements of the network is thus made to approach the mean TCR of the resistive material deposited on the entire substrate.

It is appreciated, of course, that for an ideal situation wherein the TCR varies linearly along a substrate, the biaxially symmetric arrangement of FIGS. 5A, 5B, 6 and 7 does not improve the perfect TCR tracking obtained by the arrangement of FIG. 3. However, in a more realistic situation wherein the TCR varies nonlinearly along both axis of the substrate, the biaxially symmetric arrangement which is the subject of the present application provides a further improvement to the single axis symmetry, or line symmetry, illustrated in the arrangement of FIG. 3. Although the mean TCR of each resistive element differs slightly from the mean TCR for the resistive material as a whole (because of the nonlinear variation thereof), the present approach improves the advantages provided by the arrangement of FIG. 3 which, as hereinabove illustrated, provides an improvement of 5100% over uncompensated prior art and of 2145% over prior art where temperature equalization is attempted.

Both arrangements are significant improvements over the prior art, which fails to contemplate or correct for geographic variations of TCR and merely attempts to provide a common operating temperature for all resistive components. It is also noted that, in view of the interleaving resulting from the arrangement of FIGS. 3, 5a, 5B, 6 and 7, applicants' invention further provides an increased uniformity of temperature among the various resistive elements fabricated in the resistive network, thus further improving the temperature stability of the resistance ratio.

The foregoing description of the preferred embodiment of the invention has been presented for purposes of illustration and description and is not intended to be exhaustive or to limit the invention to the precise forms disclosed, since many modifications and variations are possible in light of the above teaching.

For example, the various portions of the biaxially symmetric resistors may be interconnected by metal connectors, by resistive material, or by a combination of such connecting structures. Various types of trimming structures may be provided, for discrete or continuous trimming of resistive values. Such trimming structures may be provided for one or more resistors in a network, alone or in combination, without departing from the scope of the invention.

The illustrated embodiments were chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

What is claimed is:

1. A symmetrically arranged resistive network for providing substantially uniform temperature coefficient of resistance to a plurality of film resistors in a network formed on a substrate, comprising:
   a substrate;
   resistive material on said substrate; and
   at least three sets of resistive elements forming said resistors, wherein
   said resistive elements include a plurality of resistive portions symmetrically arranged with respect to one another relative to two axes of symmetry along said substrate,
   said plurality of resistive portions being symmetrically disposed relative to said two axes of symmetry,
   wherein said resistive portions include laser trim section means for trimming said resistive portions to provide substantially identical geometric structures to corresponding symmetrically disposed resistive portions.

2. A symmetric arrangement for providing substantially uniform characteristics to a plurality of film resistors in a network formed on a substrate, comprising:
   a substrate;
   resistive material on said substrate; and
   a plurality of resistive elements forming said resistors, wherein said resistive elements include a plurality of resistive portions symmetrically arranged with respect to one another relative to two axes of symmetry along said substrate.

3. A symmetric arrangement for providing stabilized resistance ratios to a plurality of film resistor's in a network formed on a substrate, comprising:
a substrate;
resistive material on said substrate; and
a plurality of resistive elements forming said resistors, wherein
said resistive elements include a plurality of resistive portions symmetrically arranged with respect to one another relative to two axes of symmetry along said 4. A symmetrical resistive network comprising:
a substrate;
a first resistive element supported on said substrate and having a sequence of interconnectible resistive first subelements having substantially equal power dissipation in response to an applied voltage, said first subelements spaced apart across said substrate and symmetrically arranged with respect to one another relative to two axes of symmetry of said first subelements, a first of said sequence of first subelements connectible to an input terminal and a last of said sequence of first subelements connectible to an output terminal; and
a second resistive element supported on said substrate having at least one resistive second subelement disposed on said substrate substantially equidistant between a pair of said resistive first subelements and symmetrically arranged with respect to said resistive first subelements and to one another relative to two axes of symmetry of said second subelements, said at least one resistive second subelement of said second resistive element having a portion connectible to said last of said sequence of first subelements of said first resistive element and a portion connectible to a ground terminal, whereby said first and second resistive elements have substantially uniform temperature coefficients of resistance and the temperature of said first resistive element substantially tracks the temperature of said second resistive element upon changes of an applied voltage.

5. A bisymmetrical resistive network comprising:
a substrate;
a first resistive element deposited in a serpentine pattern on said substrate and including a plurality of interconnectible first resistive subelements spaced apart across said substrate and symmetrically arranged with respect to one another relative to two axes of symmetry of said first resistive subelements, a first of said first resistive subelements connectible to an input terminal and a last of said first resistive subelements connectible to an output terminal; and
a second resistive element deposited in a serpentine pattern on said substrate having a plurality of second resistive subelements spaced across substrate symmetrically arranged with respect to one another relative to two axes of symmetry of said second resistive subelements, said second resistive subelements interleaved with the first resistive subelements of said first resistive element and symmetrically arranged with respect thereto, the first of said second resistive subelements connectible to said output terminal, whereby said first and second resistive elements have substantially uniform temperature coefficients of resistance and the temperature of said first resistive element substantially tracks the temperature of said second resistive element upon changes of an applied voltage.

6. A bisymmetrical resistive network as recited in claim 5, wherein at least one set of said first and second resistive subelements includes a plurality of trimmed resistive trimming means, said trimmed resistive trimming means symmetrically arranged with respect to one another relative to said two axes of symmetry and respectively connected to each resistive subelement of said at least one set.

7. A bisymmetrical resistive network as recited in claim 6, wherein said trimmed resistive trimming means further having substantially identical trimmed geometrical areas.

* * * * *